(12) United States Patent
Kadota et al.

(10) Patent No.: US 7,009,468 B2
(45) Date of Patent: Mar. 7, 2006

(54) SURFACE ACOUSTIC WAVE DEVICE AND ELECTRONIC DEVICE USING THE SAME

(75) Inventors: Michio Kadota, Kyoto (JP); Koji Fujimoto, Otsu (JP); Takeshi Nakao, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 255 days.

(21) Appl. No.: 10/132,281

(22) Filed: Apr. 26, 2002

(65) Prior Publication Data
US 2002/0171513 A1 Nov. 21, 2002

(30) Foreign Application Priority Data
Apr. 27, 2001 (JP) ............................. 2001-132656

(51) Int. Cl.
*H03H 9/64* (2006.01)
(52) U.S. Cl. .............. 333/195; 310/313 R; 310/313 B; 310/360
(58) Field of Classification Search ................ 333/195, 333/196; 310/313 R, 313 A, 313 B, 313 D, 310/360, 361
See application file for complete search history.

(56) References Cited

U.S. PATENT DOCUMENTS 4,965,479 A * 10/1990 Elliott et al. ............ 310/313 D
5,895,996 A * 4/1999 Takagi et al. ............ 310/313 R
5,953,433 A * 9/1999 Fujimoto et al. ............ 381/337
5,965,969 A * 10/1999 Kadota .................... 310/313 R
6,154,105 A * 11/2000 Fujimoto et al. ............ 333/194

FOREIGN PATENT DOCUMENTS

| JP | 63-198410 | 8/1988 |
| JP | 2000-323956 | 11/2000 |

OTHER PUBLICATIONS

AP Michio Kadota et al., "Small-Sized Resonator Filter using Love Type SH SAW on Quartz", Operational Committee for the 21st Symposium of Basics and Application of Ultrasonic Electronics, Nov. 6, 2000, pp. 59-60.

* cited by examiner

Primary Examiner—Timothy P. Callahan
Assistant Examiner—An T. Luu
(74) Attorney, Agent, or Firm—Keating & Bennett, LLP

(57) ABSTRACT

A small, high-performance SAW device has a large electromechanical coupling coefficient and a small number of fingers constituting reflectors, and is constructed such that losses due to electric resistance of the fingers. In the SAW device having pluralities of first fingers and second fingers, disposed on a quartz substrate, constituting an IDT for exciting SH waves and reflectors for reflecting the SH waves, respectively, the first and second fingers made mainly from Au are disposed on the ST-cut 90° X-propagation quartz substrate with the Euler angles (0°, θ, 90°±2°), wherein the angle θ is within the range of about 110° to about 150° and a normalized film thickness (H/λ) of the fingers is within the range of about 0.003 to about 0.095.

18 Claims, 11 Drawing Sheets

SURFACE ACOUSTIC WAVE DEVICE AND ELECTRONIC DEVICE USING THE SAME

BACKGROUND OF THE INVENTION

1. Field of the Invention

The present invention relates to surface acoustic wave devices (hereinafter, the term "surface acoustic wave" is abbreviated as SAW) such as SAW resonators, SAW filters, and duplexers, and more particularly, the present invention relates to a SAW device using shear-horizontal waves (hereinafter, abbreviated as SH waves).

2. Description of the Related Art

SAW filters have been widely used for band-pass filters of mobile communication devices and other electronic apparatuses. Such known SAW filters include SAW resonator filters and transversal filters.

An exemplary known SAW resonator filter is configured such that an ST-cut 0° X-propagation quartz substrate having excellent temperature characteristics has an interdigital transducer (hereinafter, abbreviated as an IDT) and reflectors disposed thereon. The IDT and the reflectors are both made from an Al electrode material, and use Rayleigh waves produced by excitation of the IDT.

Such a SAW device experiences the following problems:
(1) large losses due to a small electromechanical coupling coefficient; and
(2) difficulty in reducing the device size because of a small reflection coefficient, resulting in the need for a large number of fingers for reflectors in a device such as a SAW resonator and the SAW resonator filter.

Another exemplary known SAW filter is configured such that an ST-cut 90° X-propagation quartz substrate has an IDT and reflectors disposed thereon. The IDT and the reflectors are both made from an electrode material such as Ta and W and use SH waves produced by excitation of the IDT.

However, using an SH wave device having electrodes made from Ta or W gives rise to the following problems:
(1) difficulty in providing a SAW device which is available over a wide range of operating frequencies because of large losses due to a small electromechanical coupling coefficient and a large electric resistance of the electrodes; and
(2) difficulty in reducing the size of the SAW device because of a high acoustic speed.

SUMMARY OF THE INVENTION

In order to overcome the problems described above, preferred embodiments of the present invention provide a SAW device and an electronic device including the same, both having a significantly reduced size, high performance, a large electromechanical coupling coefficient, wherein losses due to the small electric resistance of the fingers are minimized, and the number of the fingers constituting the reflectors is also small.

According to a preferred embodiment of the present invention, a surface acoustic wave (hereinafter, the term "surface acoustic wave" is abbreviated as SAW) device preferably includes a quartz substrate, a plurality of first fingers, disposed on the quartz substrate, constituting an interdigital transducer (hereinafter, abbreviated as an IDT) for exciting shear-horizontal waves (hereinafter, abbreviated as SH waves), and a plurality of second fingers, disposed on the quartz substrate, constituting reflectors for reflecting the SH waves. The quartz substrate is preferably an ST-cut 90° X-propagation quartz substrate having Euler angles (0°, θ, 90°±2°), wherein the angle θ lies in the range of about 110° to about 150°, and the first and second fingers are made of a material including Au as a main component, and a normalized film thickness (H/λ) of the first and second fingers lies in the range of about 0.003 to about 0.095.

By disposing the fingers made mainly from Au on the ST-cut 90° X-propagation quartz substrate with the Euler angles (0°, θ, 90°±2°), there is provided a small, high-performance SAW device having a large electromechanical coupling coefficient, an excellent reflection, and a small number of the fingers constituting the reflectors when the normalized film thickness (H/λ) of the fingers lies in the range of about 0.003 to about 0.095 and the angle θ lies in the range of about 110° to about 150°, wherein losses are small owing to the small electric resistance of electrodes.

That is to say, the SAW device according to preferred embodiments of the present invention has an electromechanical coupling coefficient that is larger by a factor of about 1.5 or more and an electric resistance that is smaller than that of a comparative SAW device having Al electrodes and using X-propagation Rayleigh waves. Accordingly, the SAW device according to preferred embodiments of the present invention has smaller losses and can be used over a wider range of operating frequencies.

Also, the SAW device according to preferred embodiments of the present invention has fingers made mainly from heavy Au, leading to a slow acoustic speed (i.e., a slow surface wave speed) and thereby achieving a device with a reduced overall size.

Moreover, the SAW device has a reflective index that is about 30 times or greater than that of the comparative SAW device, thereby reducing the number of the fingers necessary to constitute the reflectors, leading to a device with a reduced overall size.

In addition, the SAW device according to preferred embodiments of the present invention has excellent properties when the device includes a unidirectional electrode.

In the SAW device according to preferred embodiments of the present invention, the normalized film thickness (H/λ) of the first and second fingers may be within the range of about 0.005 to about 0.062.

By configuring the fingers so as to have a normalized film thickness (H/λ) in the range of about 0.005 to about 0.062, the SAW device according to preferred embodiments of the present invention has an electromechanical coupling coefficient that is about two times or greater than that of the comparative SAW device, thereby achieving smaller losses and becoming available over a wider range of operating frequencies.

Also, the above-described configuration allows the SAW device to have a reflective index that is about 30 times or greater than that of the comparative SAW device, thereby achieving a reduced size of the reflectors and resulting in a device with a reduced overall size.

In the SAW device according to preferred embodiments of the present invention, the normalized film thickness (H/λ) of the first and second fingers is preferably at least about 0.01.

By configuring the fingers so as to have a normalized film thickness (H/λ) of about 0.01 or larger, the SAW device according to preferred embodiments of the present invention has an improved reflective index per finger of about 15% or more, thereby achieving a further reduced size realized by reducing the number of fingers of the reflectors. For example, the SAW device has a reflective index of about 99% or more by providing the reflectors with about 30 fingers.

In the SAW device according to preferred embodiments of the present invention, the normalized film thickness (H/λ) of the first and second fingers is preferably at least about 0.02.

By configuring the fingers so as to have a normalized film thickness (H/λ) of about 0.02 or larger, the SAW device according to preferred embodiments of the present invention has an improved reflective index per finger of about 35% or more, thus the same reduced size as that of an end surface reflection-type SAW device can be substantially achieved. For example, the SAW device has a reflective index of about 99% or more by providing the reflectors with about 10 fingers.

In the surface acoustic wave according to preferred embodiments of the present invention, the angle θ of the Euler angles preferably satisfies the following condition:

θmin≦θ≦θmax where, θmax=37500$(H/λ)^2$−135.0$(H/λ)$+128.85, and

θmin=25714$(H/λ)^2$−508.6$(H/λ)$+120.44.

By satisfying the above condition, that is, by allowing the angle θ to be between the θmin and θmax indicated in FIG. 11, the SAW device according to preferred embodiments of the present invention has an excellent frequency temperature coefficient, thus making the present invention much more effective.

According to preferred embodiments of the present invention, an electronic device includes at least one of a SAW resonator, a SAW resonator filter, a SAW ladder filter, a SAW lattice filter, and a unidirectional element, each including the SAW device according to preferred embodiments described above.

The SAW device according to a preferred embodiment of the present invention can be used as a SAW resonator, a SAW resonator filter, a SAW ladder filter, a SAW lattice filter, or a unidirectional element, thus providing a small, high-performance electronic device using the above-described SAW device.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
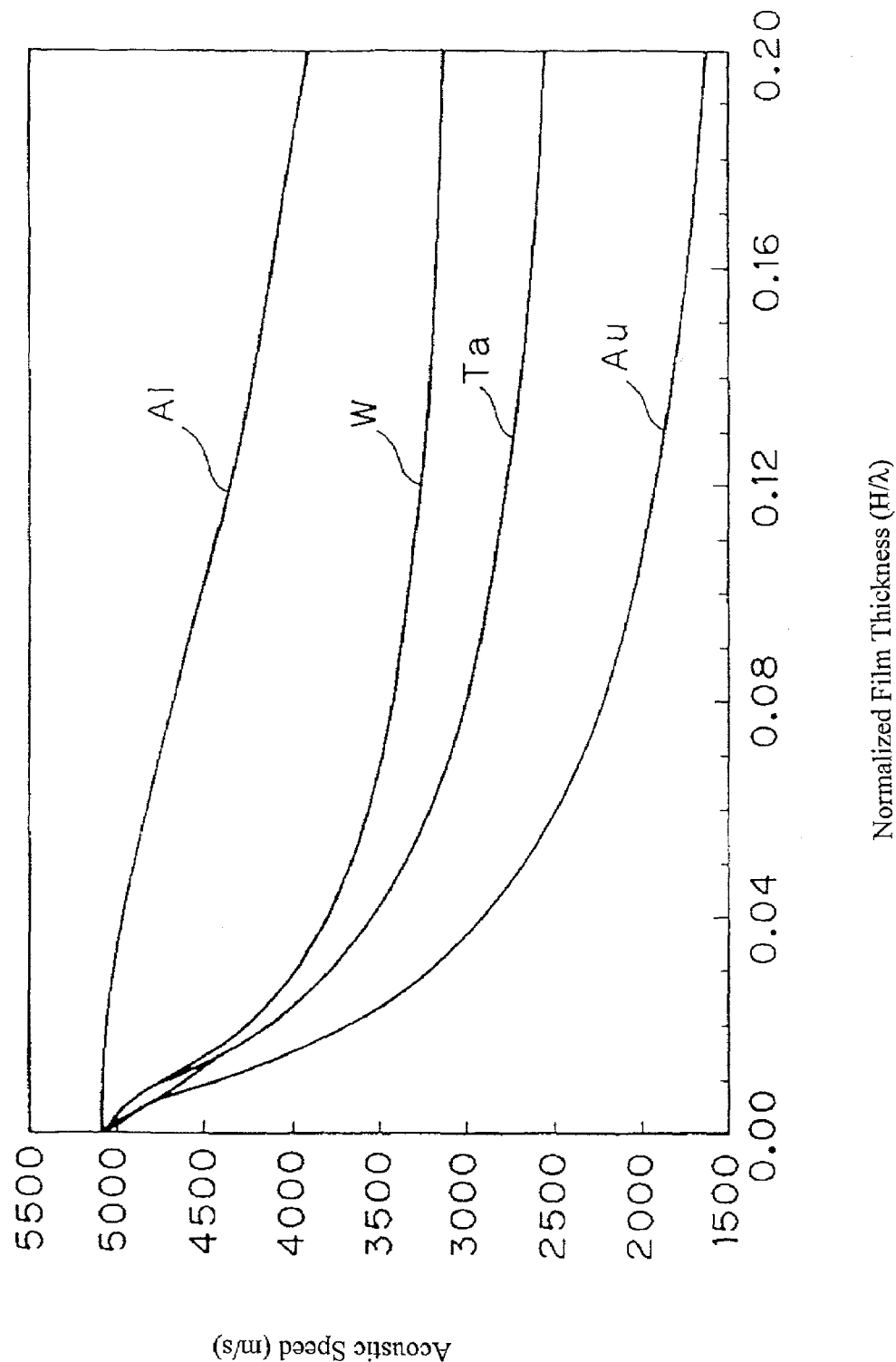
FIG. 1 is a graph illustrating the relationship between acoustic speed (SAW speed) and normalized film thickness (H/λ) of electrodes that are disposed on a quartz substrate and which are made from the metals Au, W, Ta, and Al, respectively.

FIG. 1 is a graph illustrating the relationship between acoustic speed (SAW speed) and normalized film thickness (H/λ) of electrodes that are disposed on an ST-cut 90° X-propagation quartz substrate (a 20–60° rotated Y-cut plate) with the Euler angles (0°, 110–150°, 90°±2°) and respectively, made from metals Au, W, Ta, and Al, where H and λ represent the thickness and the arrangement pitch of the electrodes, respectively.

FIG. 1 indicates that SAW devices provided with heavy Au electrodes have a slower acoustic speed (i.e., a slower surface wave speed) than that of SAW devices provided with light electrodes made from any one of W, Ta, and Al.

Accordingly, Au electrodes can reduce the size of the quartz substrate, thereby achieving a reduced size of the SAW devices.

Figure 2:
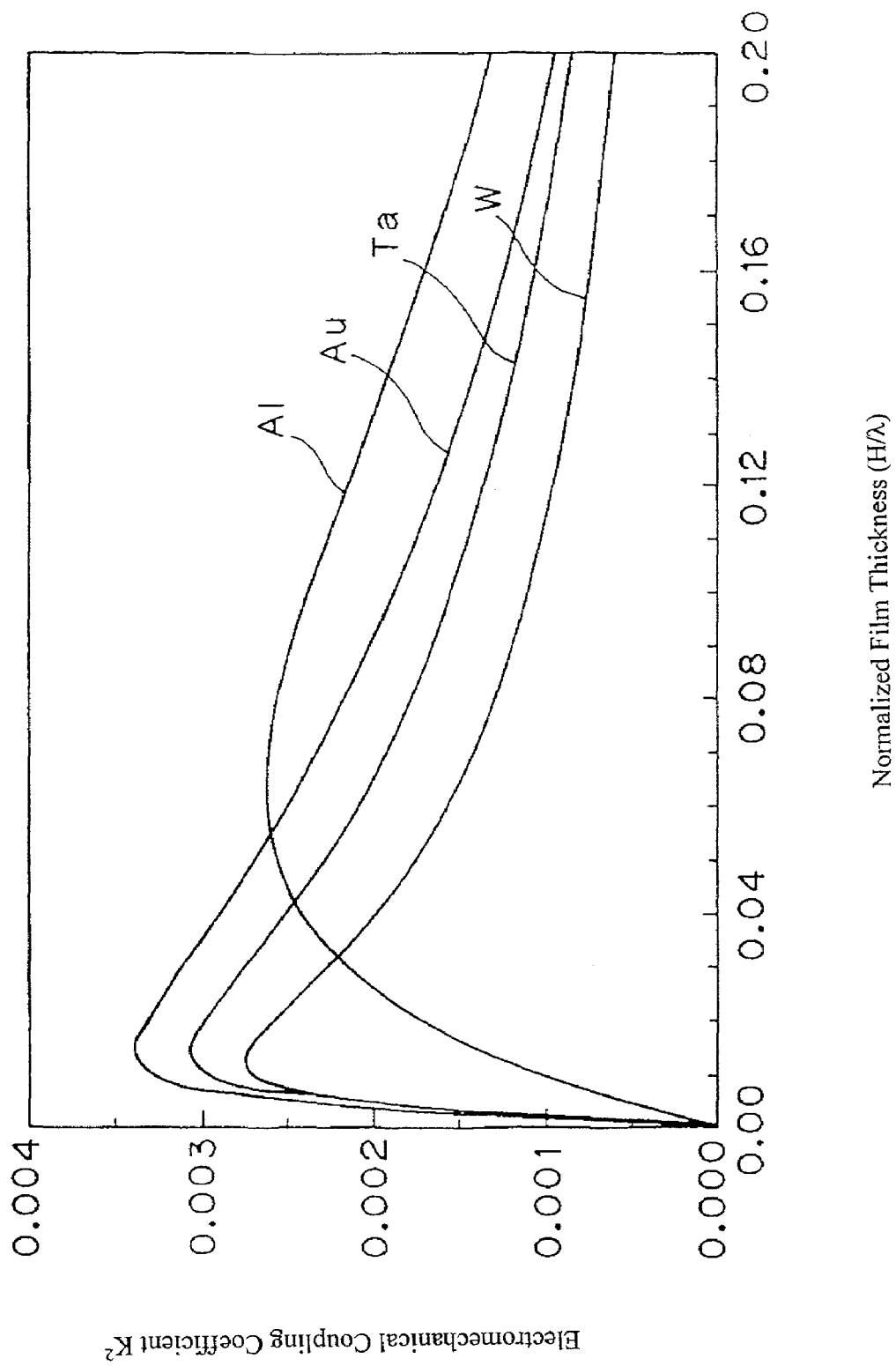
FIG. 2 is a graph illustrating the relationship between electromechanical coupling coefficient and normalized film thickness (H/λ) of electrodes that are disposed on a quartz substrate and which are made from the metals Au, W, Ta, and Al, respectively.

FIG. 2 is a graph illustrating the relationship between electromechanical coupling coefficient and normalized film thickness (H/λ) of electrodes that are disposed on an ST-cut 90° X-propagation quartz substrate (a 20–60° rotated Y-cut plate) with the Euler angles (0°, 110–150°, 90°±2°) and that are made from the metals Au, W. Ta, and Al, respectively.

FIG. 2 indicates that SAW devices provided with Au electrodes have a relatively large electromechanical coupling coefficient, and have an especially large electromechanical coupling coefficient when the normalized film thickness (H/λ) lies in the range of about 0.003 to about 0.095.

Accordingly, an Au electrode material allows SAW devices to have a large electromechanical coupling coefficient and small losses over a wide range of operating frequencies.

Figure 3:
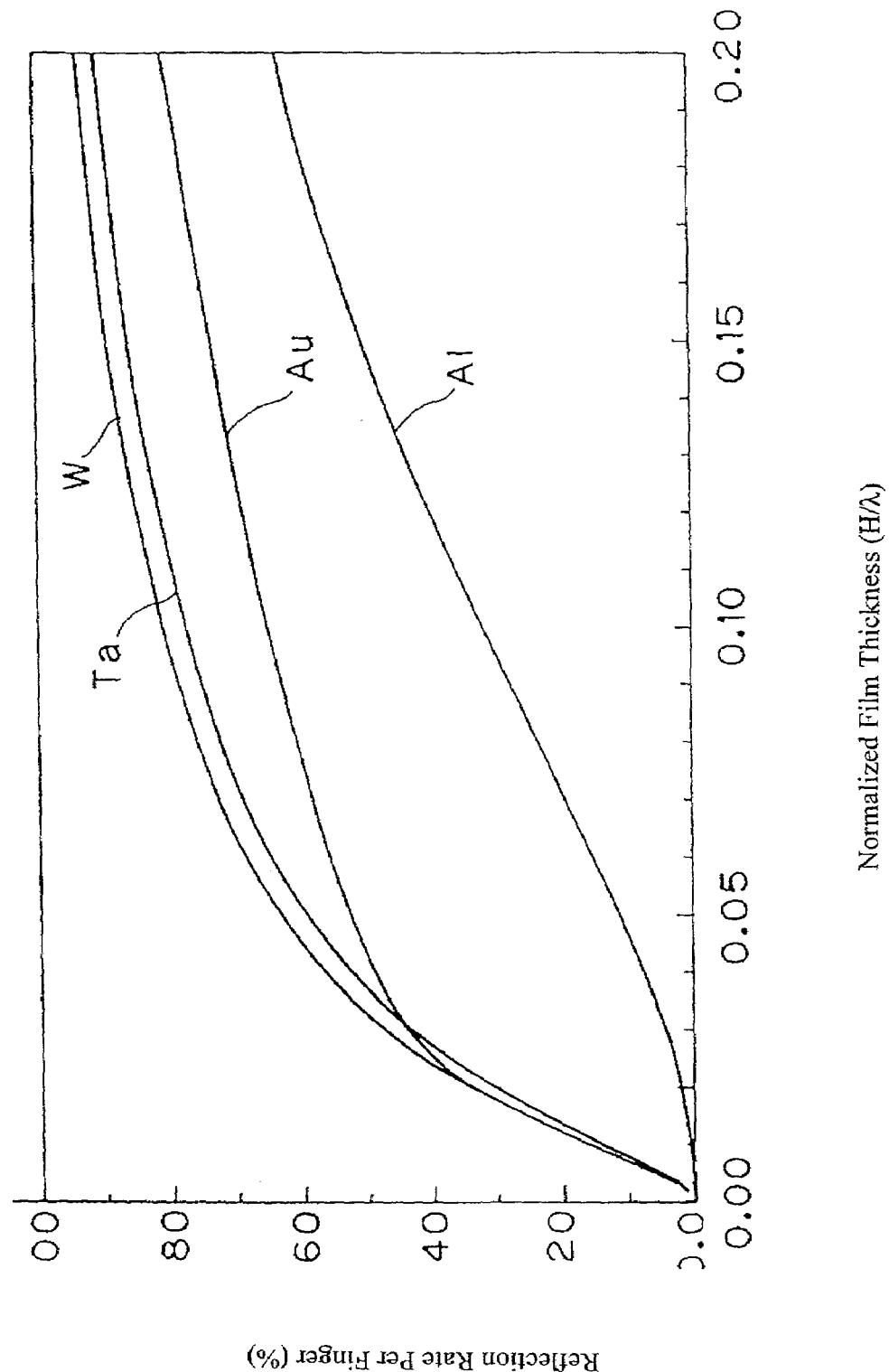
FIG. 3 is a graph illustrating the relationship between reflective index per finger and normalized film thickness (H/λ) of electrodes that are disposed on a quartz substrate and which are made from the metals Au, W, Ta, and Al, respectively.

FIG. 3 is a graph illustrating the relationship between reflective index per finger and normalized film thickness (H/λ) of electrodes that are disposed on an ST-cut 90°

X-propagation quartz substrate (a 20–60° rotated Y-cut plate) with the Euler angles (0°, 110–150°, 90°±2°) and which are made from Au, W, Ta, and Al, respectively.

As shown in FIG. 3, SAW devices provided with light Au electrodes have a reflective index per finger that is slightly smaller than or substantially equal to that of SAW devices provided with electrodes made from either one of W and Ta, and larger than that of SAW devices provided with light Al electrodes.

Accordingly, suitable conditions of the normalized film thickness (H/λ) according to preferred embodiments of the present invention allows the SAW devices to have a sufficient reflection index and a reduced size.

Figure 4:
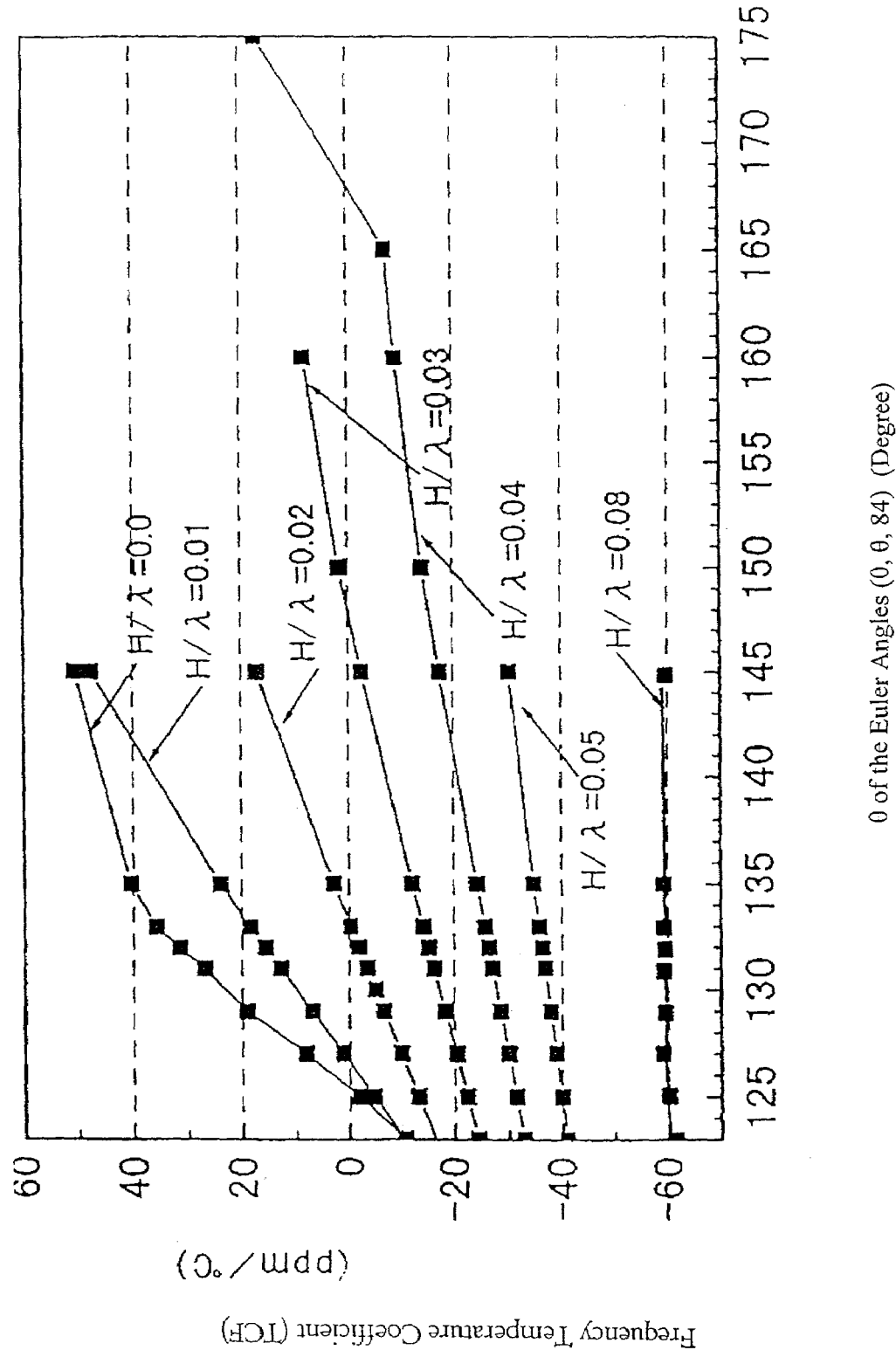
FIG. 4 is a graph illustrating the relationship between frequency temperature coefficient (TFC) and angle θ of the Euler angles (0°, θ, 90°), with another parameter of the normalized film thickness (H/λ) of Au electrodes formed on an ST-cut 90° degree X-propagation quartz substrate with the Euler angles (0°, θ, 89°)

FIG. 4 is a graph illustrating the relationship between frequency temperature coefficient (TFC) and angle θ of the Euler angles (0°, θ, 89°), with another parameter of the normalized film thickness (H/λ) of Au electrodes disposed on an ST-cut 90° X-propagation quartz substrate.

As shown in FIG. 4, the frequency temperature coefficient (TFC) lies mostly in the range of about −60 ppm/° C. to about +60 ppm/° C. when the normalized film thickness (H/λ) of the Au electrodes lies in the range of about 0.01 to about 0.08 and the angle θ lies in the range of about 120° to about 150°, thus allowing SAW devices to have an excellent frequency temperature coefficient.

Features of preferred embodiments according to the present invention will be described further in detail.

Figure 5A:
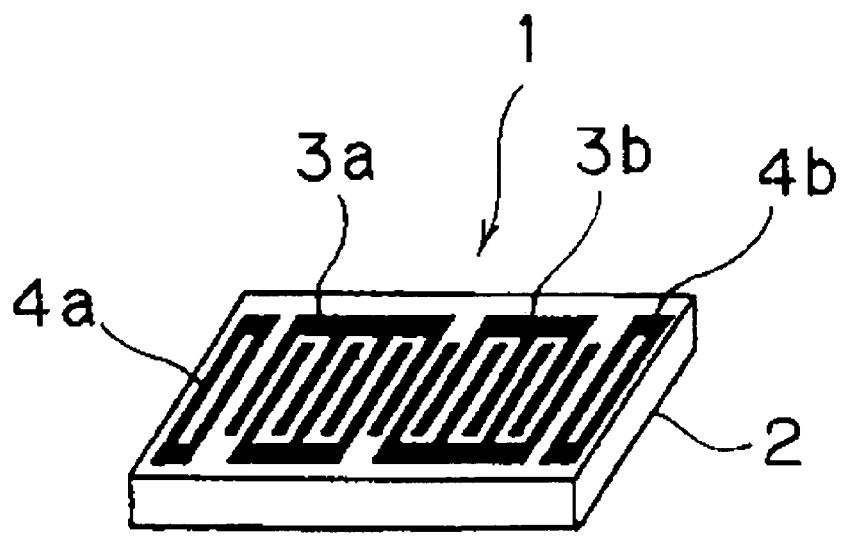
FIG. 5A and FIG. 5B are perspective views, respectively, schematically illustrating a longitudinally coupled resonator filter as a first exemplary SAW device according to a first preferred embodiment of the present invention and a known longitudinally coupled resonator filter (as a comparative example)

FIG. 5A is a perspective view schematically illustrating a longitudinally coupled resonator filter as a first exemplary SAW device according to a first preferred embodiment of the present invention.

As shown in FIG. 5A, the longitudinally coupled resonator filter 1 is configured such that two IDTs 3a and 3b for exciting SH waves are disposed on an ST-cut 90° X-propagation quartz substrate, i.e., piezoelectric substrate, (a 20–60° rotated Y-cut plate) 2 with the Euler angles (0°, 110–150°, 90°±2°) and two reflectors 4a and 4b for reflecting the SH waves are arranged so as to sandwich the IDTs 3a and 3b therebetween.

The IDTs 3a and 3b and the reflectors 4a and 4b are preferably made from an electrode material made mainly from Au. Each of the IDTs 3a and 3b has a pair of comb-shape electrodes which are arranged such that the teeth portions of the pair of comb-shape electrodes interdigitate with each other.

Also, each of the IDTs 3a and 3b and the reflectors 4a and 4b has fingers that are arranged substantially to the propagation direction of the first SAW device.

In addition, fingers constituting the IDTs 3a and 3b and the reflectors 4a and 4b preferably have a normalized film thickness (H/λ) in the range of about 0.003 to about 0.095. The longitudinally coupled resonator filter 1 has fingers made mainly from Au that are disposed on the ST-cut 90° X-propagation quartz substrate 2 with an angle θ in the range of about 110° to about 150° of the Euler angles and that have a normalized film thickness (H/λ) in the range of about 0.003 to about 0.095. Thus, compared to a comparative SAW device having Al electrodes and using X-propagation Rayleigh waves, this configuration allows the SAW device to have an electromechanical coupling coefficient that is larger by a factor of about 1.5 or more and to have smaller losses due to a smaller electric resistance of the fingers made mainly from Au, and accordingly to be available over a wider range of operating frequencies.

In addition, this configuration allows the SAW device to have an excellent reflection property of the fingers made mainly from Au, and to have a reduced size of the reflectors by reducing the number of fingers constituting the reflectors, thereby achieving a device with a substantially reduced overall size.

Figure 5B:
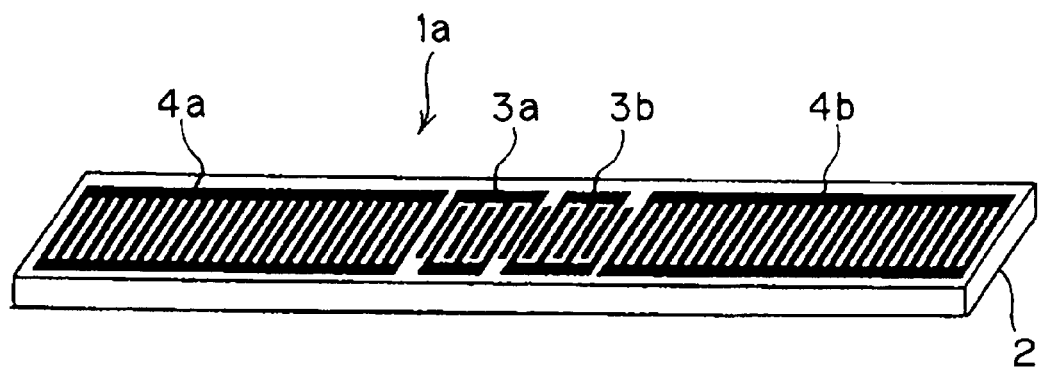

FIG. 5B is a perspective view schematically illustrating a known longitudinally coupled resonator filter 1a (as a comparative example) that has Al electrodes disposed on an ST-cut 0° X-propagation quartz substrate and that uses Rayleigh waves. Like reference numerals in FIG. 5B denote the same elements in FIG. 5A.

As is obvious from FIGS. 5A and 5B, in the longitudinally coupled resonator filter 1 according to the first preferred embodiment, the number of fingers of the reflectors 4a and 4b is much smaller than in the known longitudinally coupled resonator filter 1a.

In the longitudinally coupled resonator filter 1, the reflective index of the fingers is three times or greater than that of the conventional fingers, thus the number of fingers of the reflectors 4a and 4b required to reflect almost all SAW waves radiated from the IDTs 3a and 3b is much smaller (i.e., one third or less of that of the conventional fingers).

Figure 6:
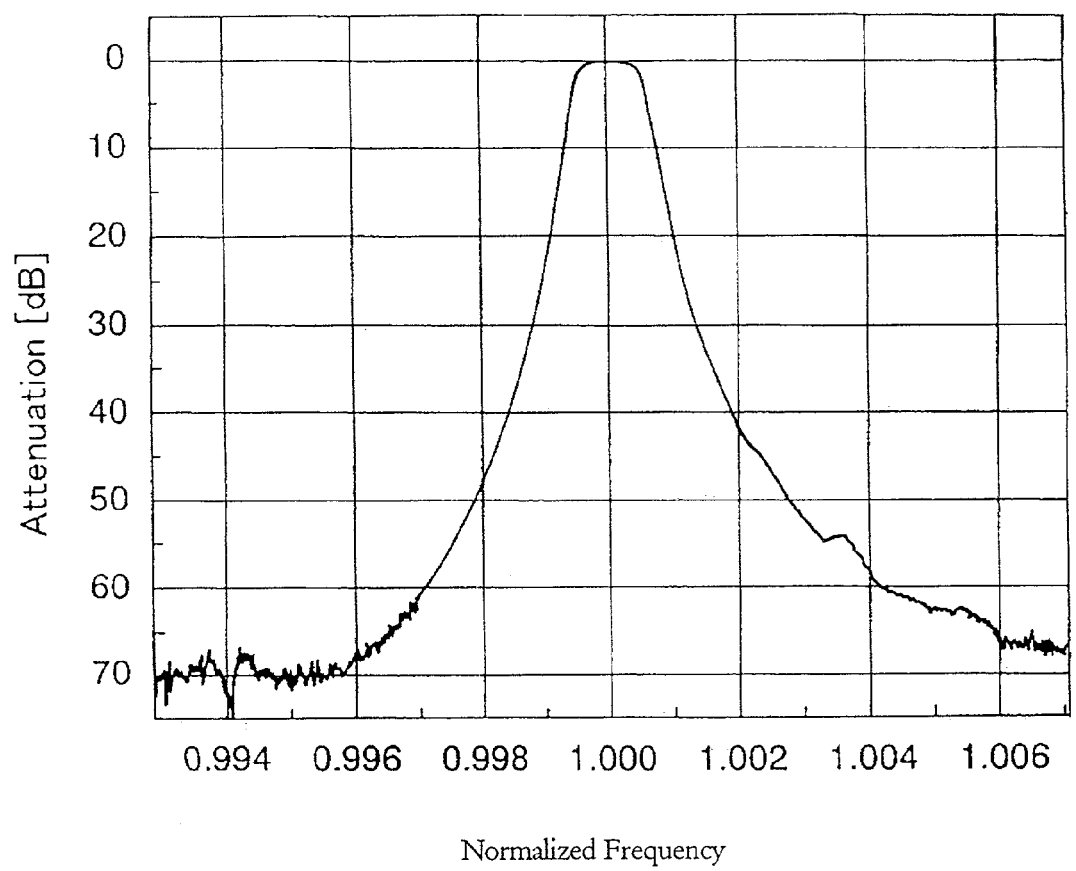
FIG. 6 is a graph of the test result which illustrates the relationship between attenuation and normalized frequency (f/$f_0$) of the longitudinally coupled resonator filter according to the first preferred embodiment, where f is a frequency of the filter and $f_0$ is a reference frequency.
Figure 7:
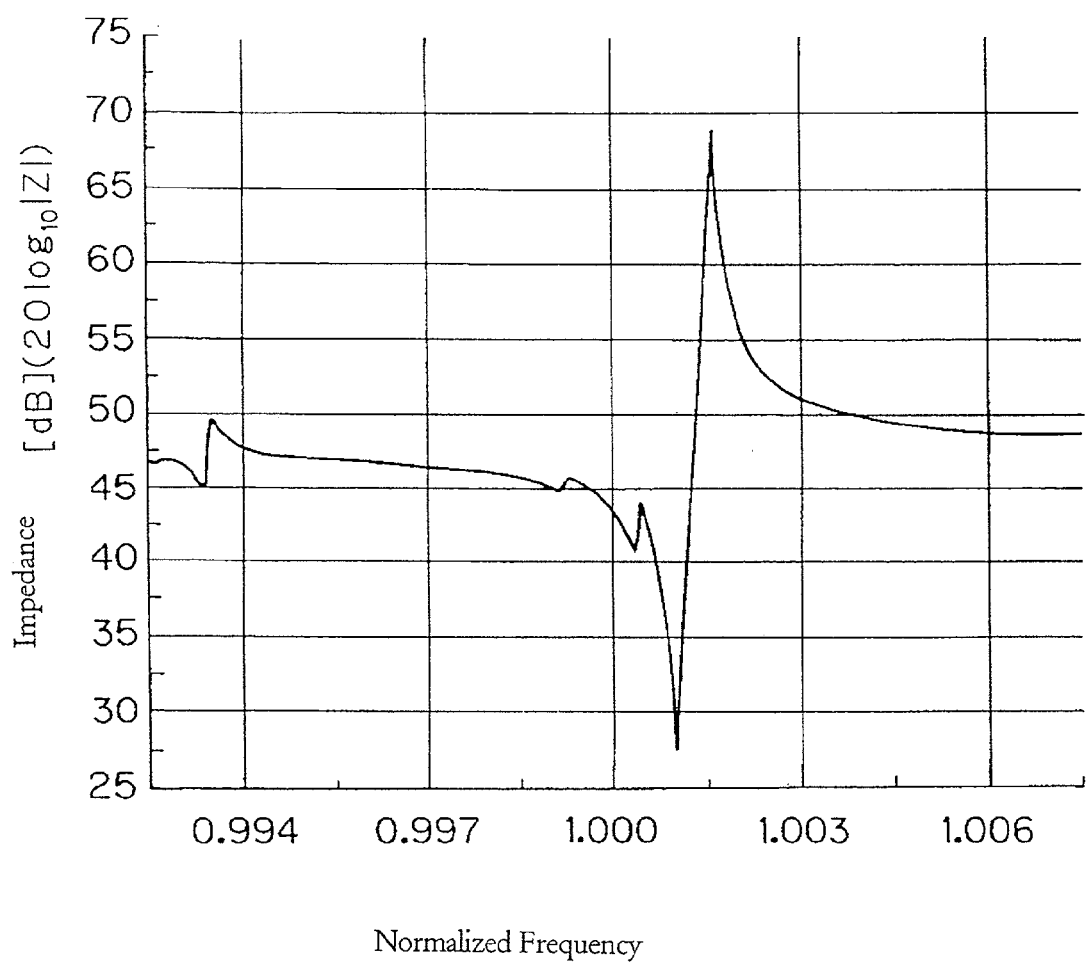
FIG. 7 is a graph of the test result which illustrates the relationship between impedance and normalized frequency of a one-port resonator as a type of the longitudinally coupled resonator filters according to the first preferred embodiment of the present invention.

FIG. 6 is a graph of the test results which illustrates the relationship between attenuation and normalized frequency (f/f$_0$) and FIG. 7 is a graph of the test result which illustrates the relationship between impedance and normalized frequency, respectively, of a one-port resonator as a type of the longitudinally coupled resonators filter shown in FIG. 5A, where f is a frequency of the filter and f$_0$ is a reference frequency.

The test conditions of the longitudinally-coupled resonator filter are as follows:
 substrate: quartz, Euler angles (0°, 127°, 90°)
 finger material: Au
 normalized film thickness (H/λ): 0.009
 metallization ratio: 0.75
 number of pairs of IDTs: 10
 number of fingers of reflectors: 10

It is obvious from FIGS. 6 and 7 that preferred embodiments of the present invention provides a SAW filter having a small number of fingers constituting reflectors, a reduced size, and an excellent frequency characteristic.

Figure 8:
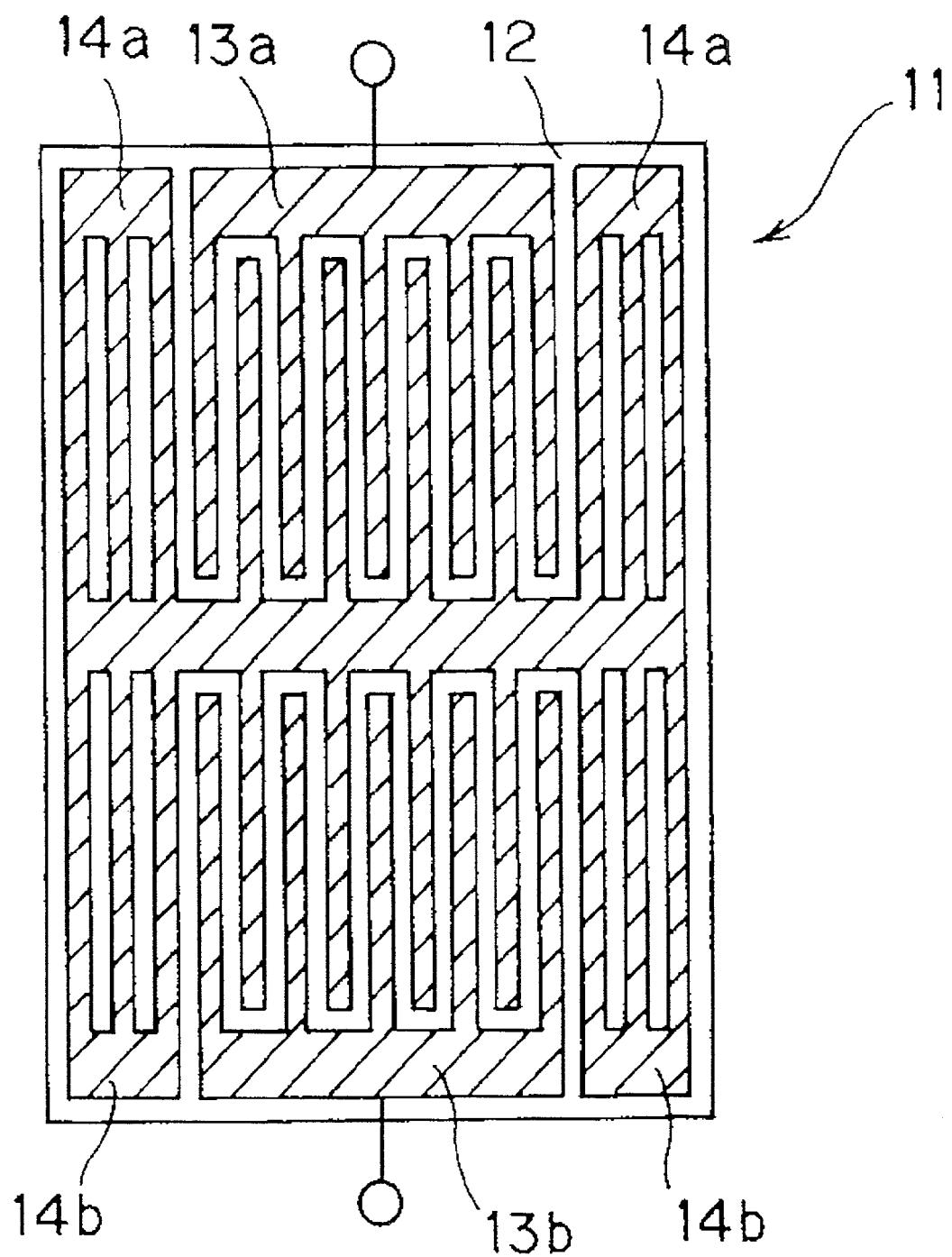
FIG. 8 is a plan view of a transversely coupled SAW filter as a second exemplary SAW device according to a second preferred embodiment of the present invention.

FIG. 8 is a plan view a transversely coupled SAW filter as a second exemplary SAW device according to a second preferred embodiment of the present invention. As shown in FIG. 8, the transversely coupled resonator filter 11 is configured such that two IDTs 13a and 13b for exciting SH waves are disposed on an ST-cut 90° X-propagation quartz substrate (piezoelectric substrate) 12 with the Euler angles (0°, 110–150°, 90°±2°) and two pairs of reflectors 14a and 14b for reflecting the SH waves are arranged so as to sandwich the IDTs 13a and 13b, respectively.

The IDTs 13a and 13b and the reflectors 14a and 14b are preferably made from an electrode material made mainly from Au. Each of the IDTs 13a and 13b has a pair of comb-shape electrodes which are arranged such that the teeth portions of the pair of comb-shape electrodes interdigitate with each other.

Also, each of the IDTs 13a and 13b and the reflectors 14a and 14b has fingers that are substantially perpendicular to the propagation direction of the second SAW device. In addition, fingers constituting the IDTs 13a and 13b and the reflectors 14a and 14b preferably have a normalized film thickness (H/λ) in the range of about 0.003 to about 0.095.

The transversely coupled SAW filter 11 according to the second preferred embodiment achieves the same advantages as those of the first preferred embodiment.

The present invention also provides a multi-step filter configured by longitudinally connecting a plurality of the first SAW devices shown in FIG. 5A according to the first preferred embodiment or the second SAW devices shown in FIG. 8 according to the second preferred embodiment. The multi-step filter also achieves the same advantages as those of the first and second preferred embodiments.

Figure 9:
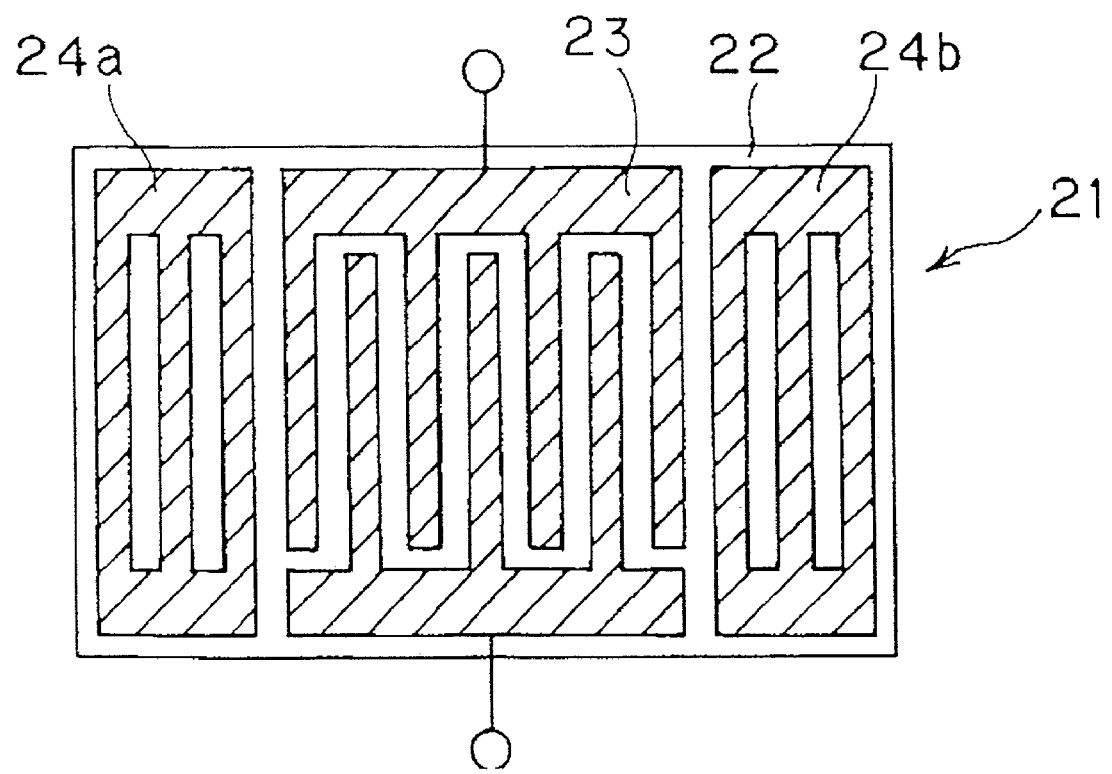
FIG. 9 is a plan view of a SAW resonator as a third exemplary SAW device according to a third preferred embodiment of the present invention.

FIG. 9 is a plan view of a SAW resonator as a third exemplary SAW device according to a third preferred embodiment of the present invention.

As shown in FIG. 9, the SAW resonator 21 is configured such that a single IDT 23 for exciting SH waves is disposed on an ST-cut 90° X-propagation quartz substrate (piezoelectric substrate) 22 with the Euler angles (0°, 110–150°, 90°±2°) and two reflectors 24a and 24b for reflecting the SH waves are arranged so as to sandwich the IDT 23 therebetween.

The IDT 23 and the reflectors 24a and 24b are preferably made from an electrode material made mainly from Au. The IDT 23 has a pair of comb-shape electrodes which are arranged such that the teeth portions of the pair of comb-shape electrodes interdigitate with each other.

Also, fingers constituting the IDT 23 and the reflectors 24a and 24b preferably have a normalized film thickness (H/λ) in the range of about 0.003 to about 0.095.

Figure 10:
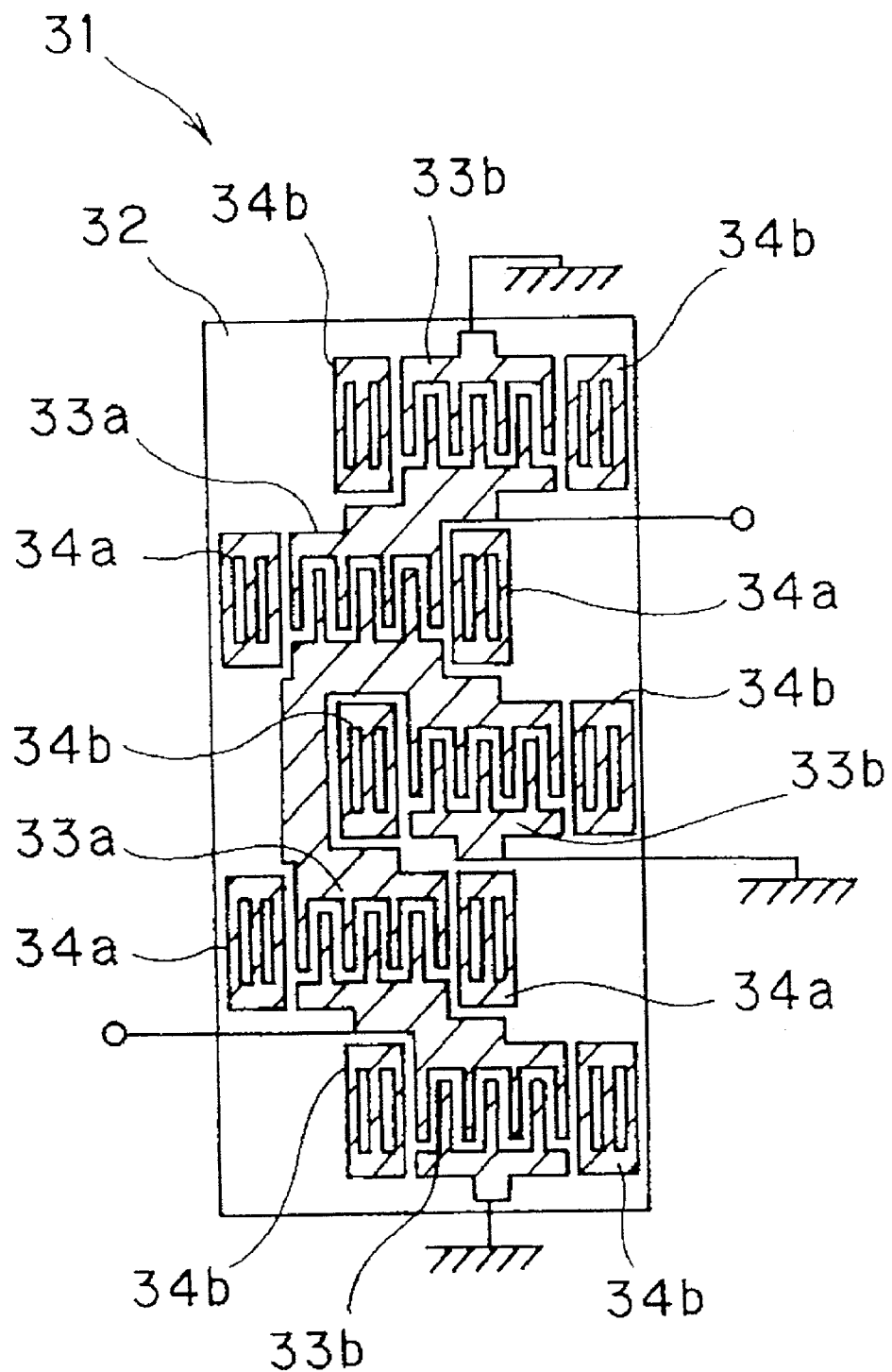
FIG. 10 is a plan view of a SAW ladder filter as a fourth exemplary SAW device according to a fourth preferred embodiment of the present invention.

FIG. 10 is a plan view of a ladder SAW filter as a fourth exemplary SAW device according to a fourth preferred embodiment of the present invention.

As shown in FIG. 10, the ladder SAW filter 31 is configured such that pluralities of IDTs 33a and 33b for exciting SH waves are disposed on an ST-cut 90° X-propagation quartz substrate (piezoelectric substrate) 32 with the Euler angles (0°, 110–150°, 90°±2°) and also pluralities of reflectors 34a and 34b for reflecting the SH waves are arranged so that each pair of the reflectors 34a and 34b sandwiches each of the IDTs 33a and 33b, respectively.

The IDTs 33a and 33b and the reflectors 34a and 34b are preferably made from an electrode material made mainly from Au. Each of the IDTs 33a and 33b has a pair of comb-shape electrodes which are arranged such that the teeth portions of the pair of comb-shape electrodes interdigitate with each other.

The pluralities of IDTs 33a and 33b are arranged in a series arm and parallel arms, respectively, so as to provide a ladder-type SAW device. Likewise in the first to third preferred embodiments, fingers constituting the IDTs 33a and 33b and the reflectors 34a and 34b preferably have a normalized film thickness (H/λ) in the range of about 0.003 to about 0.095 in this preferred embodiment.

The third and fourth SAW devices according to the third and fourth preferred embodiments shown in FIGS. 9 and 10, respectively, achieve the same advantages as those of the first preferred embodiment.

In the SAW devices according to the first to fourth preferred embodiments, by configuring the fingers so as to have a normalized film thickness (H/λ) in the range of about 0.005 to about 0.062, the SAW devices have an electromechanical coupling coefficient that is about two times or greater than that of the comparative SAW device, thereby achieving a SAW device of which losses are further smaller and which is available over a wider range of operating frequencies. In addition, the SAW devices according to the preferred embodiments of the present invention have a reflection index that is about 30 times or greater than that of the comparative SAW device, thereby achieving a reduced size of the reflectors and resulting in a small SAW device.

Also, in the SAW devices according to the first to fourth preferred embodiments, by configuring the fingers so as to have a normalized film thickness (H/λ) of about 0.01 or larger, the SAW devices have a larger reflective index per finger, thereby achieving a further larger reflective index and a further reduced size.

Furthermore, in the SAW devices according to the first to fourth preferred embodiments, by configuring the fingers so as to have a normalized film thickness (H/λ) of about 0.02 or larger, the SAW devices have a further larger reflective index per finger, thus the same reduced size as that of an end surface reflection-type SAW device can be substantially achieved.

Figure 11:
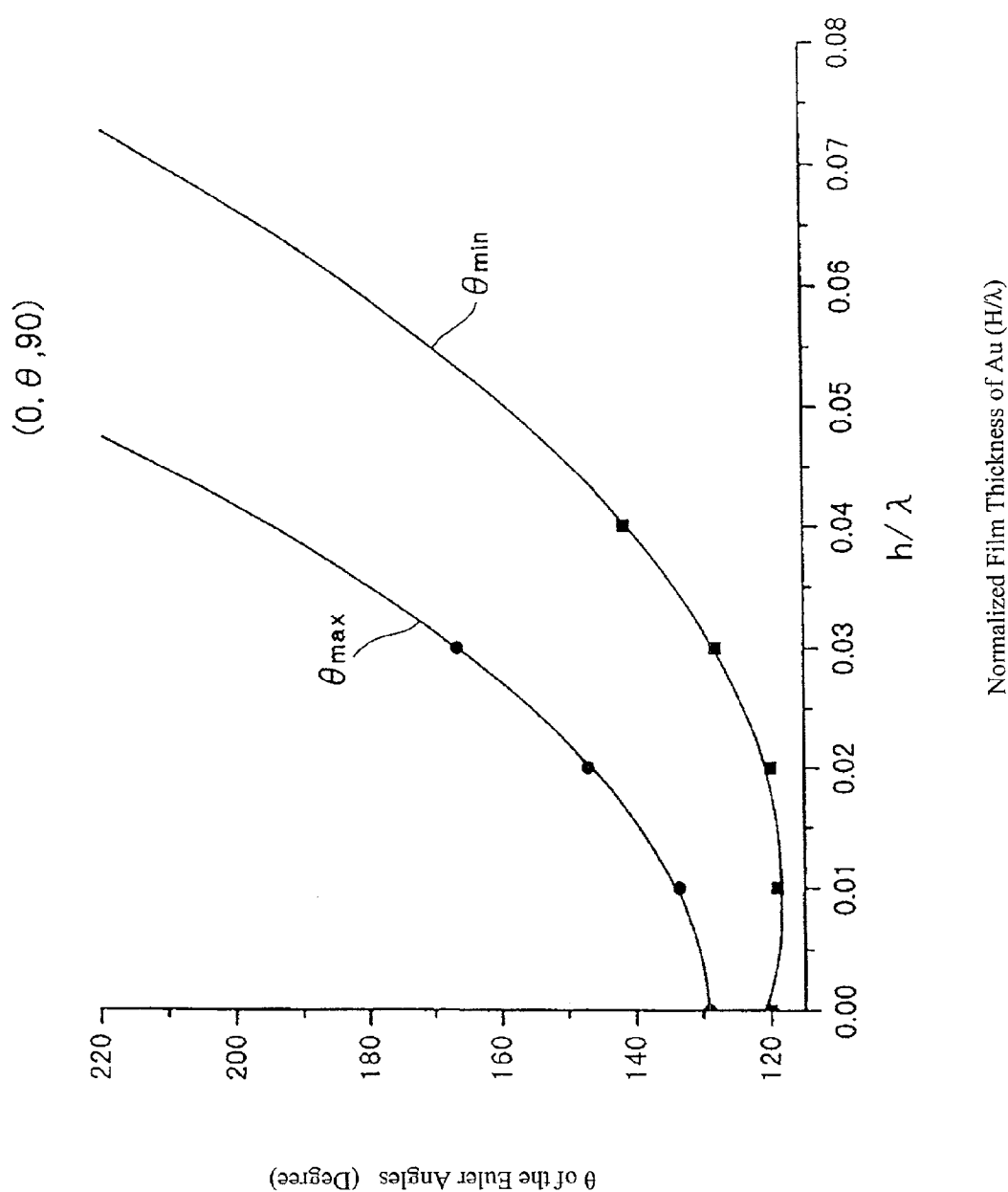
FIG. 11 is a graph illustrating the relationship between angle θ of the Euler angles and normalized film thickness (H/λ) for providing the range of excellent frequency temperature coefficients.

By allowing an angle θ of the Euler angles to satisfy the following condition, that is, by allowing the angle θ to lie between the θmin and θmax indicated in FIG. 11, the SAW devices according to the first to fourth preferred embodiments have an excellent first-order frequency temperature coefficient at ambient temperatures or so.

$$\theta min \leq \theta \leq \theta max$$

where, $\theta max = 37500(H/\lambda)^2 - 135.0(H/\lambda) + 128.85$, and $$\theta min = 25714(H/\lambda)^2 - 508.6(H/\lambda) + 120.44.$$

Although in the first to fourth preferred embodiments, a SAW resonator and a SAW filter are described as exemplary SAW devices, the present invention is not limited these devices, but are applicable to other types of SAW filters such as a transversal filter and also to other types of SAW devices excluding filters.

Also, the present invention is not limited to the foregoing preferred embodiments, but the specific shape of a quartz substrate, arrangement of fingers constituting an IDT and reflectors, the number of fingers, normalized film thickness of the fingers and so on can be modified or changed without departing from the scope of the spirit of the present invention.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device, comprising:
   a quartz substrate;
   a plurality of first fingers, disposed on the quartz substrate, constituting an interdigital transducer (IDT) for exciting shear-horizontal waves (SH waves); and
   a plurality of second fingers, disposed on the quartz substrate, for reflecting the SH waves; wherein
   the quartz substrate is an ST-cut 90° X-propagation quartz substrate with the Euler angles (0°, θ, 90°±2°) wherein the angle θ is within the range of about 110° to about 150°, the first and second fingers are made of a material including Au as a main component, and a normalized film thickness (H/λ) of the first and second fingers is within the range of about 0.003 to about 0.095.

2. The surface acoustic wave device according to claim 1, wherein the normalized film thickness (H/λ) of the first and second fingers is within the range of about 0.005 to about 0.062.

3. The surface acoustic wave device according to claim 1, wherein the normalized film thickness (H/λ) of the first and second fingers is at least about 0.01.

4. The surface acoustic wave device according to claim 1, wherein the normalized film thickness (H/λ) of the first and second fingers is at least about 0.02.

5. The surface acoustic wave device according to claim 1, wherein the angle θ of the Euler angles satisfies the following condition:

$$\theta_{min} \leq \theta \leq \theta_{max}$$

where, $\theta_{max} = 37500(H/\lambda)^2 - 135.0(H/\lambda) + 128.85$, and $\theta_{min} = 25714(H/\lambda)^2 - 508.6(H/\lambda) + 120.44$.

6. The surface acoustic wave device according to claim 1, wherein the frequency temperature coefficient is within the range of about −60 ppm/° C. to about +60 ppm/° C.

7. The surface acoustic wave device according to claim 1, wherein the plurality of second fingers define two reflectors disposed on the quartz substrate so as to sandwich the interdigital transducer.

8. The surface acoustic wave device according to claim 1, wherein the surface acoustic wave device is a transversely coupled surface acoustic wave filter.

9. An electronic device comprising at least one of a SAW resonator, a SAW resonator filter, a ladder-type SAW filter, a SAW lattice filter, and a unidirectional element, each including the SAW device according to claim 1.

10. A surface acoustic wave device, comprising:
a quartz substrate;
at least one interdigital transducer disposed on the quartz substrate for exciting shear-horizontal waves; and
a plurality of reflectors disposed on the quartz substrate for reflecting the shear-horizontal waves; wherein
the quartz substrate is an ST-cut 90° X-propagation quartz substrate with the Euler angles (0°, θ, 90°±2°), wherein the angle θ is within the range of about 110° to about 150°, the at least one interdigital transducer and plurality of reflectors are made of a material including Au as a main component, and a normalized film thickness (H/λ) of the at least one interdigital transducer and plurality of reflectors is within the range of about 0.003 to about 0.095.

11. The surface acoustic wave device according to claim 10, wherein the normalized film thickness (H/λ) of the at least one interdigital transducer and plurality of reflectors is within the range of about 0.005 to about 0.062.

12. The surface acoustic wave device according to claim 10, wherein the normalized film thickness (H/λ) of the at least one interdigital transducer and plurality of reflectors is at least about 0.01.

13. The surface acoustic wave device according to claim 10, wherein the normalized film thickness (H/λ) of the first and second fingers is at least about 0.02.

14. The surface acoustic wave device according to claim 10, wherein the angle ζ of the Euler angles satisfies the following condition:

$$\theta_{min} \leq \theta \leq \theta_{max}$$

where, $\theta_{max} = 37500(H/\lambda)^2 - 135.0(H/\lambda) + 128.85$, and $\theta_{min} = 25714(H/\lambda)^2 - 508.6(H/\lambda) + 120.44$.

15. The surface acoustic wave device according to claim 10, wherein the frequency temperature coefficient is within the range of about −60 ppm/° C. to about +60 ppm/° C.

16. The surface acoustic wave device according to claim 10, wherein the plurality of reflectors are disposed on the quartz substrate so as to sandwich the interdigital transducer.

17. The surface acoustic wave device according to claim 10, wherein the surface acoustic wave device is a transversely coupled surface acoustic wave filter.

18. An electronic device comprising at least one of a SAW resonator, a SAW resonator filter, a ladder-type SAW filter, a SAW lattice filter, and a unidirectional element, each including the SAW device according to claim 10.

* * * * *